(12) United States Patent
Blank

(10) Patent No.: US 9,443,972 B2
(45) Date of Patent: Sep. 13, 2016

(54) SEMICONDUCTOR DEVICE WITH FIELD ELECTRODE

(75) Inventor: Oliver Blank, Villach (AT)

(73) Assignee: Infineon Technologies Austria AG, Villach (AT)

( * ) Notice: Subject to any disclaimer, the term of this patent is extended or adjusted under 35 U.S.C. 154(b) by 405 days.

(21) Appl. No.: 13/307,465

(22) Filed: Nov. 30, 2011

(65) Prior Publication Data

US 2013/0137230 A1 May 30, 2013

(51) Int. Cl.
| | |
|---|---|
| *H01L 29/861* | (2006.01) |
| *H01L 29/872* | (2006.01) |
| *H01L 29/78* | (2006.01) |
| *H01L 29/40* | (2006.01) |
| *H01L 29/66* | (2006.01) |
| *H01L 29/417* | (2006.01) |
| *H01L 29/423* | (2006.01) |
| *H01L 29/06* | (2006.01) |

(52) U.S. Cl.
CPC ......... *H01L 29/7802* (2013.01); *H01L 29/407* (2013.01); *H01L 29/66734* (2013.01); *H01L 29/7813* (2013.01); *H01L 29/861* (2013.01); *H01L 29/8725* (2013.01); *H01L 29/0634* (2013.01); *H01L 29/41766* (2013.01); *H01L 29/42368* (2013.01); *H01L 29/42376* (2013.01)

(58) Field of Classification Search
CPC ... H01L 21/28; H01L 29/861; H01L 29/872; H01L 29/407
USPC ...................................... 438/270; 257/E21.41
See application file for complete search history.

(56) References Cited

U.S. PATENT DOCUMENTS

| | | | |
|---|---|---|---|
| 6,787,847 B2 | 9/2004 | Disney | |
| 6,882,005 B2 | 4/2005 | Disney | |
| 7,829,944 B2 | 11/2010 | Disney | |
| 7,859,037 B2 | 12/2010 | Parthasarathy et al. | |
| 8,022,456 B2 | 9/2011 | Parthasarathy et al. | |
| 2002/0056884 A1* | 5/2002 | Baliga | 257/492 |
| 2005/0032291 A1* | 2/2005 | Baliga | 438/212 |
| 2005/0167749 A1* | 8/2005 | Disney | 257/341 |
| 2006/0097312 A1* | 5/2006 | Poelzl et al. | 257/328 |
| 2006/0209586 A1* | 9/2006 | Hirler | 365/149 |
| 2008/0073707 A1* | 3/2008 | Darwish | 257/330 |
| 2009/0085106 A1* | 4/2009 | Matsunaga | 257/330 |
| 2009/0108343 A1* | 4/2009 | Nemtsev et al. | 257/330 |
| 2010/0155773 A1* | 6/2010 | Parthasarathy et al. | 257/139 |
| 2010/0308400 A1* | 12/2010 | Darwish et al. | 257/330 |
| 2013/0062688 A1 | 3/2013 | Kobayashi et al. | |

FOREIGN PATENT DOCUMENTS

CN 101572236 A 11/2009

* cited by examiner

*Primary Examiner* — Jerome Jackson, Jr.
*Assistant Examiner* — Lamont Koo
(74) *Attorney, Agent, or Firm* — Murphy, Bilak & Homiller, PLLC

(57) ABSTRACT

A method of producing a semiconductor device includes providing a semiconductor body having a first surface and a dielectric layer arranged on the first surface and forming at least one first trench in the dielectric layer. The at least one first trench extends to the semiconductor body and defines a dielectric mesa region in the dielectric layer. The method further includes forming a second trench in the dielectric mesa region distant to the at least one first trench, forming a semiconductor layer on uncovered regions of the semiconductor body in the at least one first trench and forming a field electrode in the second trench.

16 Claims, 8 Drawing Sheets

SEMICONDUCTOR DEVICE WITH FIELD ELECTRODE

TECHNICAL FIELD

Embodiments of the present invention relate to a method for producing a semiconductor device with a field electrode.

BACKGROUND

Power semiconductor devices, such as power MOS (metal-oxide-semiconductor) transistors or power diodes, include a drift region and a pn junction between the drift region and a further device region, such as a body region in an MOS transistor and an emitter region in a diode. The doping concentration of the drift region is lower than the doping concentration of the further device region, so that a depletion region (space charge region) mainly expands in the drift region when the device blocks, which is when the pn junction is reverse biased.

The dimension (length) of the drift region in a current flow direction of the device and the doping concentration of the drift region mainly define the voltage blocking capability of the semiconductor device. In a unipolar device, such as a power MOSFET, the doping concentration of the drift region also defines the on-resistance of the device, which is the electrical resistance of the semiconductor device in the on-state.

When the pn junction is reverse biased dopant atoms are ionized on both sides of the pn junction resulting in a space charge region that is associated with an electrical field. The integral of the magnitude of the field strength of the electrical field corresponds to the voltage that reverse biases the pn junction, whereas the maximum of the electrical field is at the pn junction. An Avalanche breakthrough occurs when the maximum of the electrical field reaches a critical field strength that is dependent on the type of semiconductor material used to implement the drift region.

The doping concentration of the drift region may be increased without reducing the voltage blocking capability of the device when charges are provided in the drift region that may act as counter charges to ionized dopant atoms in the drift region when the pn junction is reverse biased.

According to a known concept, at least one field electrode or field plate is provided in the drift region, is dielectrically insulated from the drift region by a field electrode dielectric, and may provide the required counter charges. The field electrode can be connected to one of the load terminals of the semiconductor device, such as the source terminal in an MOS transistor or the anode terminal in a diode. A voltage across the field electrode dielectric is dependent on the magnitude of the voltage that is applied between the load terminals and that reverse biases the pn junction and on the length of the field electrode in the current flow direction. Depending on the voltage blocking capability of the semiconductor device, the voltage across the field electrode can be up to several 100V, so that a thickness of the field electrode dielectric of up to several micrometers (µm) is required. In a semiconductor device having a voltage blocking capability of 300V, the required thickness of the field electrode dielectric is, for example, between 3 µm and 4 µm.

In vertical power semiconductor devices the field electrode and the field electrode dielectric are arranged in a trench. The field electrode and the field electrode dielectric can be formed by oxidizing sidewalls of trench, so as to form an oxide layer as field electrode dielectric, and by filling a residual trench with a field electrode material. Thick vertically extending oxide layers that are able to withstand high voltages, however, induce mechanical stress that may cause defects or damages of the semiconductor body.

There is therefore a need to provide a method for producing a semiconductor device with a thick vertically extending dielectric layer.

SUMMARY

A first embodiment relates to a method of producing a semiconductor device. The method includes providing a semiconductor body having a first surface and a dielectric layer arranged on the first surface, and forming at least one first trench in the dielectric layer, the at least one first trench extending to the semiconductor body and defining a dielectric mesa region in the dielectric layer. The method further includes forming a second trench in the dielectric mesa region distant to the at least one first trench, forming a semiconductor layer on uncovered regions of the semiconductor body in the at least one first trench, and forming a field electrode in the second trench.

A second embodiment relates to a method for forming a MOS transistor. The method includes providing a semiconductor body including a field electrode and a field electrode dielectric, with the field electrode dielectric insulating the field electrode from semiconductor regions of the semiconductor body. The method further includes forming at least one trench in the field electrode dielectric distant to the field electrode, and forming a gate electrode in the at least one trench.

Those skilled in the art will recognize additional features and advantages upon reading the following detailed description, and upon viewing the accompanying drawings.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

FIG. 1 which includes

FIG. 14 which includes

DETAILED DESCRIPTION

In the following Detailed Description, reference is made to the accompanying drawings, which form a part thereof, and in which is shown by way of illustration specific embodiments in which the invention may be practiced. In this regard, directional terminology, such as "top", "bottom", "front", "back", "leading", "trailing" etc., is used with reference to the orientation of the FIGs. being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1A:
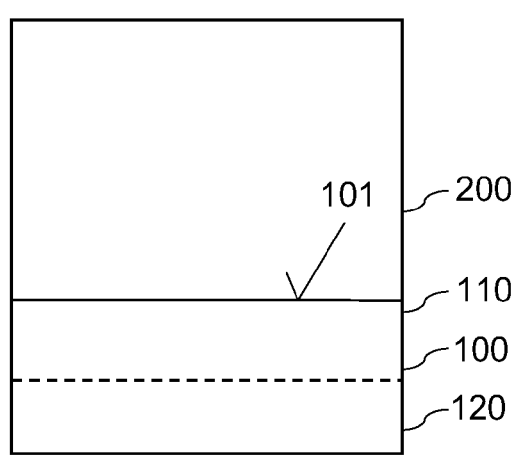
FIGS. 1A to 1C illustrates a first embodiment of a method for producing a semiconductor device including a field electrode.
Figure 1B:
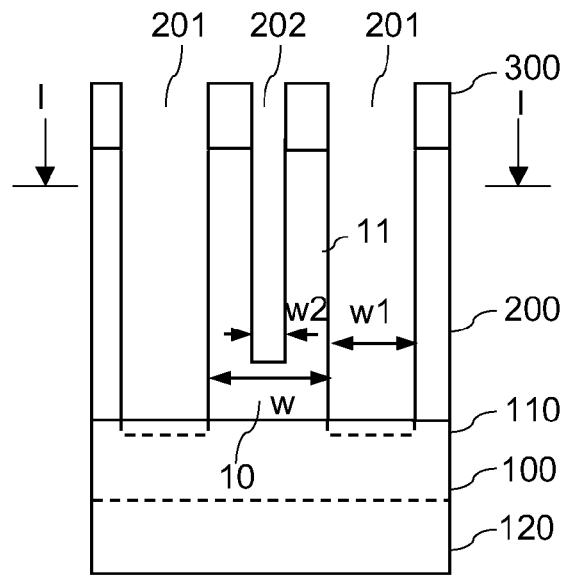
Figure 1C:
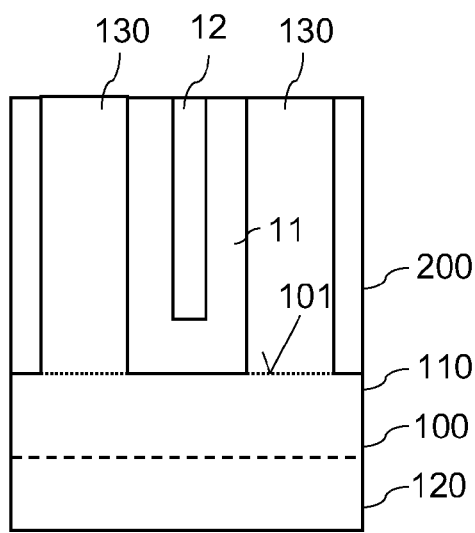

FIGS. 1A to 1C illustrate a first embodiment of a method for producing a semiconductor device that includes a field electrode and a field electrode dielectric in a semiconductor body, with the field electrode dielectric dielectrically insulating the field electrode from semiconductor regions of the semiconductor body. Referring to FIG. 1A the method includes providing a semiconductor body 100 having a first surface 101 and having a dielectric layer 200 arranged on the first surface 101. The semiconductor body 100 may include a conventional semiconductor material, such as silicon (Si), silicon carbide (SiC), gallium arsenide (GaAs), gallium nitride (GaN), or the like. The semiconductor body 100 is, in particular, a monocrystalline semiconductor body. According to one embodiment, the semiconductor body 100 has a basic doping with a homogenous doping concentration. According to a further embodiment (illustrated in dashed lines in FIG. 1A), the semiconductor body 100 includes at least two differently doped semiconductor layers, namely a first layer 110 on which the dielectric layer 200 is arranged, and a second layer 120 on which the first layer 110 is arranged. According to one embodiment, the second layer 120 is a semiconductor substrate, and the first layer 110 is an epitaxial layer. The second layer 120 may have a higher doping concentration than the first layer 110. The two semiconductor layers 110 and 120 may have a same doping type, which is either an n-type or a p-type, or may have different doping types.

The dielectric layer 200 arranged on the first surface 101 of the semiconductor body 100 is, for example, a conventional dielectric layer, such as an oxide layer, a nitride layer, a high-k dielectric layer, a low-k dielectric layer, or the like.

The arrangement with the semiconductor body 100 and the dielectric layer 200 will be referred to as semiconductor arrangement in the following. FIG. 1A, as well as FIGS. 1B and 1C, show a vertical cross sectional view of the semiconductor arrangement, which is a cross sectional view in a section plane that is perpendicular to the first surface 101 of the semiconductor body 100.

Referring to FIG. 1B, the method further includes forming at least one trench 201 in the dielectric layer 200. The at least one first trench 201 extends to the semiconductor body 100 and defines a dielectric mesa region 10 in the dielectric layer 200. "To extend to the semiconductor body 100" means that the at least one first trench 201 extends through the dielectric layer 200 to the first surface 101 of the semiconductor body 100 or into the semiconductor body 100, so as to uncover regions of the semiconductor body 100 at a bottom of the at least one first trench 201. There are various options to form or define the dielectric mesa region 10 by forming the at least one first trench 201. Two of these different options are explained with reference to FIGS. 2 and 3 below. Each of these FIGS. 2 and 3 illustrates a horizontal cross sectional view of the semiconductor arrangement in a horizontal section plane I-I that extends through the dielectric layer 200 at a position illustrated in FIG. 1B.

Figure 2:
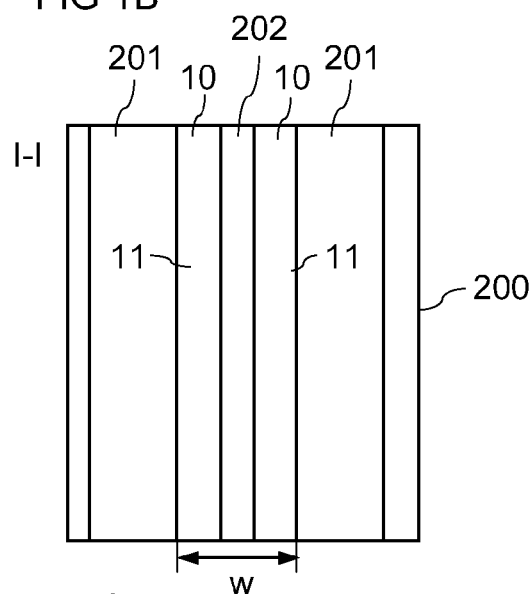
FIG. 2 illustrates a horizontal cross sectional view of a semiconductor device according to FIG. 1C according to a first embodiment.

Referring to FIG. 2, the method includes forming two elongated first trenches 201 that are distant in a direction perpendicular to the longitudinal direction. The dielectric mesa region 10 is an elongated mesa region 10 arranged between the two elongated first trenches 201. A width w of the dielectric mesa region 10 is defined by a distance between the two first trenches 201. Of course, several dielectric mesa regions 10 can be formed in one semiconductor arrangement by forming a plurality of first elongated trenches 201 in the dielectric layer 200.

Figure 3:
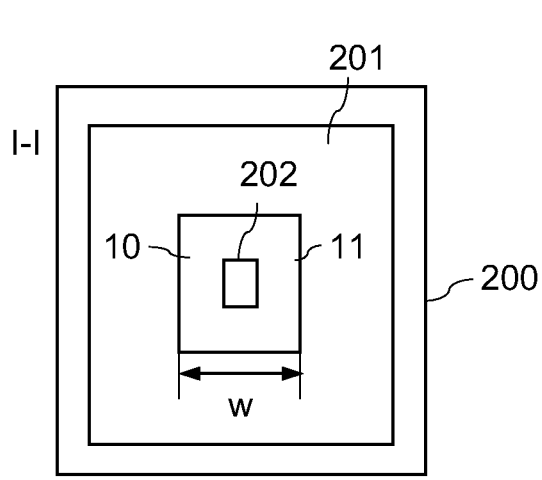
FIG. 3 illustrates a horizontal cross sectional view of a semiconductor device according to FIG. 1C according to a second embodiment.

Referring to FIG. 3, one ring-shaped first trench 201 is formed that defines the dielectric mesa region 10. In the embodiment illustrated in FIG. 3, the first trench 201 has the form of a rectangular ring, so that the dielectric mesa region 10 is pile-shaped and has a rectangular cross section in a horizontal plane I-I. However, this is only an example. The first trench 201 could also be formed to include any other geometry, such as the geometry of an elliptical ring, a circular ring, a hexagonal ring, or any other polygonal ring. The method according to FIG. 3 can easily be modified to produce a plurality of pile-shaped dielectric mesa regions 10 by forming the at least one first trench 201 to have the form of a grid in the horizontal plane.

The at least one first trench 201 can be formed by employing a conventional method for forming a trench in a dielectric layer. According to one embodiment illustrated in FIG. 1B, the method includes forming an etch mask 300 and etching the at least one first trench 201 using the etch mask 300. The etching process includes, for example, an anisotropic etching process. In this method, the width w of the dielectric mesa region 10 is defined by the etch mask 300 and is, therefore, only defined by a lithographic process.

Referring to FIG. 1B, the method further includes forming a second trench 202 in the dielectric mesa region 10 distant to the at least one first trench 201. Horizontal cross sectional views of this second trench 202 are also illustrated in FIGS. 2 and 3. Forming the second trench 202 may also include an etching process using an etch mask. According to one embodiment, the at least one first trench 201 and the second trench 202 are etched in one common etching process using one etch mask, such as the etch mask 300 illustrated in FIG. 1B.

In the embodiment illustrated in FIG. 1B, the second trench 202 does not extend to the semiconductor body 100, so that a bottom of the second trench 202 is in the dielectric mesa region 10. Forming the at least one first trench 201 to extend to or into the semiconductor body 100 and forming the second trench 202 to extend not to the semiconductor body 100 may include forming the at least one first trench 201 and the second trench 202 with different trench widths w1, w2. The at least one first trench 201 is wider than the second trench 202, so that w1>w2. In anisotropic etching processes an etch rate is dependent on a trench width and increases with increasing trench width. When, as illustrated in FIG. 1B, the at least one first trench 201 is wider than the second trench 202 the etch rate in the at least one first trench 201 is higher than the second trench 202, so that in the etching process the at least one first trench 201 reaches the semiconductor body 100 when a bottom of the second trench 202 is still distant to the semiconductor body 100. According to one embodiment, the etching process stops when the semiconductor body 100 is uncovered at the bottom of the at least one first trench 201. An optical inspection method can be used to detect when the at least one first trench 201 reaches the semiconductor body 100.

Referring to FIG. 1C, the method further includes forming a semiconductor layer 130 on uncovered regions of the semiconductor body 100 in the at least one first trench 201. Referring to FIG. 1C, forming the semiconductor layer 130 may include completely filling the at least one first trench 201 with a semiconductor material. According to one embodiment, the semiconductor layer 130 is a monocrystalline semiconductor layer. This monocrystalline semiconductor layer 130 can be formed by an epitaxial process, specifically a selective epitaxial process. In a selective epitaxial process, the semiconductor layer 130 grows as a monocrystalline semiconductor layer on uncovered regions of the semiconductor body 100 but does not grow on the dielectric layer 200 on the sidewalls of the at least one trench 201. A selective epitaxial process is a combination of an epitaxial process and an etching process. In this process semiconductor atoms that are provided through a gaseous precursor are incorporated into the crystal lattice of the semiconductor body 100 in those regions that are uncovered, so that the semiconductor layer 130 grows on these uncovered regions. On the dielectric layer 200, however, the semiconductor atoms provided through the precursor form agglomerations that can act as seed crystals for a crystal growth when they reach a critical size. The etching process, however, prevents these seeds from reaching the critical size so that there is no semiconductor growth on the dielectric layer 200. Selective epitaxial processes are commonly known, so that no further explanations are required in this regard.

The semiconductor material of the semiconductor layer 130 corresponds to the semiconductor material of at least the first semiconductor layer 110 of the semiconductor body 100. The doping concentration of the semiconductor layer 130 may correspond to the doping concentration of the semiconductor body 100 or may be different from the doping concentration of the semiconductor body 100. According to one embodiment, the semiconductor layer 130 is produced to have a varying doping concentration in the vertical direction.

In the second trench 202 a field electrode 12 is formed. Forming the field electrode 12 includes, for example, completely filling the second trench 202 with an electrode material. The electrode material is, for example, a metal, a silicide, or polycrystalline semiconductor material, such as doped polysilicon. The field electrode 12 in the second trench 202 can be formed before forming the semiconductor layer 130 or after forming the semiconductor layer 130. According to one embodiment, the field electrode 12 is formed after the semiconductor layer 130 has been formed, and forming the field electrode 12 includes depositing an electrode material in the second trench 202 and on the dielectric mesa region 10 and the semiconductor layer 130 and removing the deposited electrode material on top of the dielectric mesa region 10 and the semiconductor layer 130. Removing the electrode material from the dielectric mesa region 10 and the semiconductor layer 130 includes, for example, a polishing process, such as a chemical, a mechanical or a chemical-mechanical polishing (CMP) process, or an etching process that etches the electrode material selectively relative to the dielectric layer 200.

The field electrode 12 is dielectrically insulated from semiconductor regions of the semiconductor arrangement by sections of the dielectric mesa region 10. The dielectric mesa region 10 forms a field electrode dielectric 11 that dielectrically insulates the field electrode 12 from semiconductor regions of the semiconductor arrangement. A thickness d of the field electrode dielectric 11 between the field electrode 12 and the semiconductor layer 130 is defined by the distance between the at least one first trench 201 and the second trench 202. This distance is defined by the etch mask 300, so that the thickness d of the field electrode dielectric 11 is only defined by a lithographic process. Thus, the thickness d of the field electrode dielectric 11 can be easily adjusted by suitably producing the etch mask 300 as desired. According to one embodiment, the second trench 202 is formed in the middle of the dielectric mesa region 10 between the two first trenches 201 or between trench sections of the first trench 201, so that the field electrode dielectric 11 has the same thickness on both sides of the dielectric mesa region 10, which is (w−w2)/2 in the embodiment according to FIG. 1B.

A thickness of the field electrode dielectric 11 below the field electrode 12, which means between the field electrode 12 and the first surface 101 of the semiconductor body 100, is also defined by the etching process, where this thickness is defined by the duration of the etching process and a width w2 of the second trench 202. According to one embodiment, the second trench 202 is formed such that the thickness of the field electrode dielectric 11 at the bottom of the second trench 202 is larger than the thickness at the sidewalls. According to a further embodiment, the thickness of the field electrode dielectric 11 at the bottom of the second trench 202 is smaller than the thickness at the sidewalls. In this case, there is an increased electric field in the semiconductor region below the second trench 202, so that an Avalanche breakthrough occurs in this region of the device when a high voltage is applied between the field electrode 12 and the surrounding semiconductor material.

In the embodiment illustrated in FIG. 1B the at least one first trench 201 and the second trench 202 are formed to have vertical sidewalls, which are sidewalls perpendicular to the first surface 101 of the semiconductor body and perpendicular to a surface of the dielectric layer 200. However, this is only an example. According to a further embodiment, the at least one first trench 201 and the second trench 202 are formed to have tapered sidewalls, which are sidewalls defining an angle of more than 90° with the first surface 101 of the semiconductor body 100. According to one embodiment, a (taper) angle is between 90° and 105° relative to the first surface 101, or between 0° and 15° relative to a vertical direction, where the vertical direction is a direction perpendicular to the first surface 101 of the semiconductor body 100.

Figure 4:
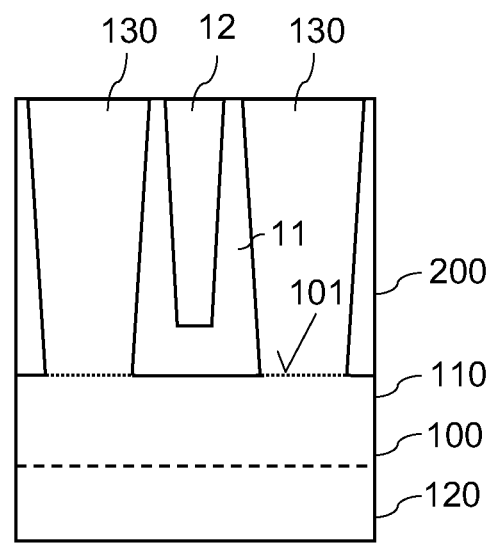
FIG. 4 illustrates a vertical cross sectional view of a semiconductor device including a field electrode and a field electrode dielectric according to a further embodiment.

FIG. 4 illustrates a vertical cross sectional view of a semiconductor device including a field electrode 12 formed in a tapered second trench 202 and including at least one semiconductor layer 130 formed in a tapered first trench 201. In this embodiment, the dielectric layer 11 has a varying thickness between the field electrode 12 and the semiconductor layer 130, with the thickness increasing in the direction of the semiconductor body 100, because in the direction of the semiconductor body 100 the at least one first trench 201, in which the semiconductor layer 130 is formed and the second trench 200, in which the field electrode 12 is formed, each become narrower.

Figure 5:
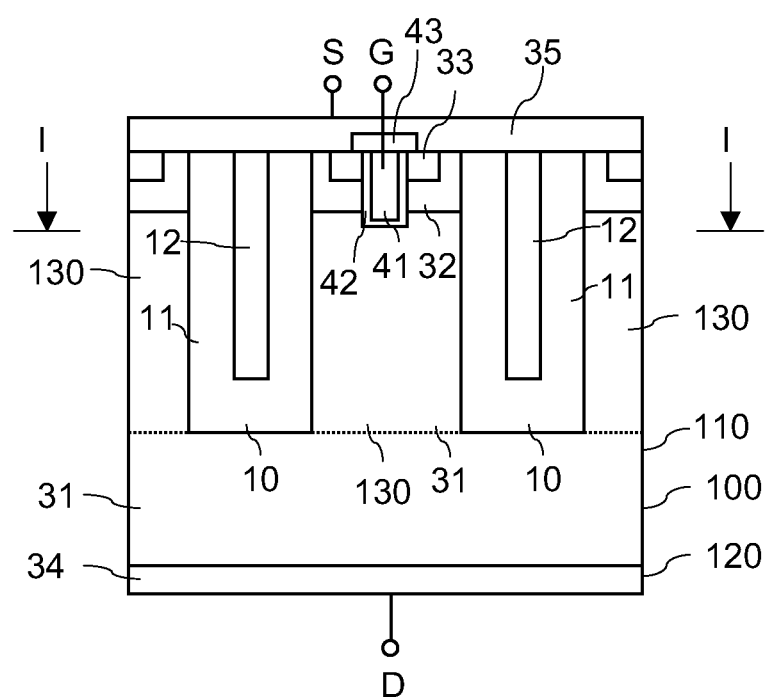
FIG. 5 illustrates a vertical cross sectional view of a MOS transistor including a field electrode according to a first embodiment.
Figure 6:
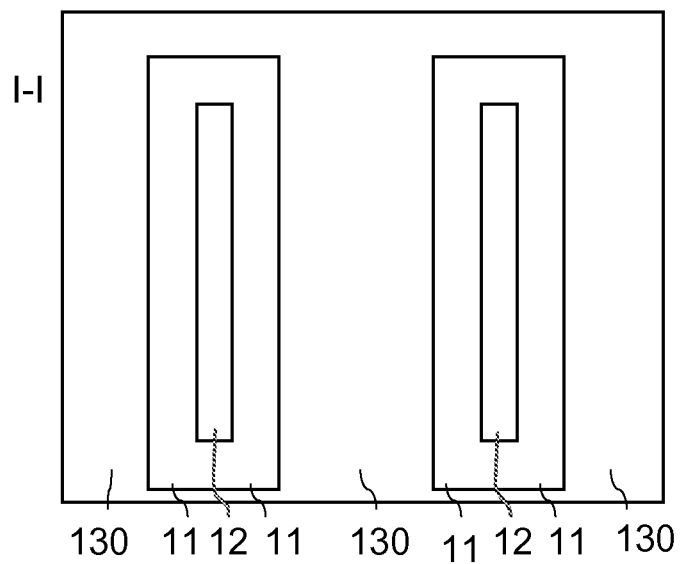
FIG. 6 illustrates a horizontal cross sectional view of a MOS transistor with a field electrode structure according to a first embodiment.
Figure 7:
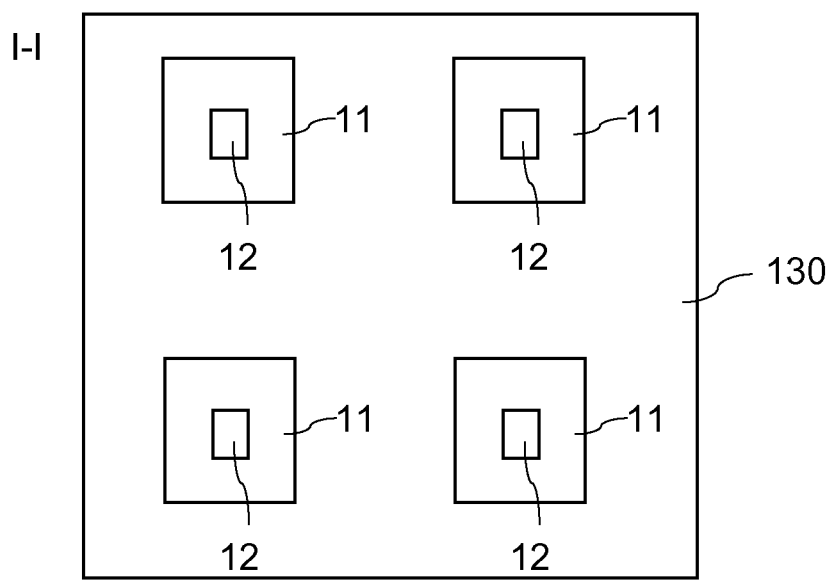
FIG. 7 illustrates a horizontal cross sectional view of a MOS transistor with a field electrode structure according to a second embodiment.

Semiconductor arrangements as illustrated in FIGS. 1C and 4 including a field electrode 12 and a field electrode dielectric 11 surrounding the field electrode 12 may form the basis for a plurality of different semiconductor devices. Several embodiments of semiconductor devices are explained with reference to FIGS. 5 to 7 below. The semiconductor devices illustrated in FIGS. 5 to 7 are MOS transistors with a field electrode 12 and field electrode dielectric 11 having vertical sidewalls as illustrated in FIG. 1C. However, a field electrode 12 and a field electrode dielectric 11 with tapered sidewalls as illustrated in FIG. 4 may be implemented in these MOS transistors as well.

Referring to FIG. 5, the MOS transistor includes a drift region 31, a body region 32 and a source region 33. The body region 32 is formed in the semiconductor layer 130, and the source region 33 is formed in the body region 32. The body region 32 is arranged between the source region 33 and the drift region 31. The body region 32 and the source region 33 can be produced by conventional diffusion and/or implantation processes in which dopant atoms are diffused and/or implanted into the semiconductor layer 130. It is also possible to already produce the body region 32 and the source region 33 during growth of the semiconductor layer 130 in the process explained with reference to FIG. 1C. It is commonly known that in an epitaxial process differently doped semiconductor regions can be produced. The drift region 31 is, for example, formed by those regions of the semiconductor layer 130 that have a basic doping concentration of the semiconductor layer 130, while the body region 32 and the source region 33 are higher doped regions formed by diffusion and/or implantation processes.

In the embodiment illustrated in FIG. 5, the semiconductor layer 130 is arranged between two dielectric mesa regions 10 or between two sections of one dielectric mesa region 10 each including a field electrode 12. In the horizontal plane I-I the geometry of the semiconductor layer 130 forming the drift region 31 and including the body region 32 and the source region 33 and, consequently, the geometry of the field electrode 12 and the field electrode dielectric 11 is defined by the geometry of the at least one first trench 201 explained with reference to FIG. 1B. Three different geometries are explained with reference to FIGS. 6 to 8 below.

Referring to FIG. 6, which illustrates a horizontal cross sectional view of an MOS transistor according to a first embodiment, the dielectric mesa regions 10 and the semiconductor layer 130 each are elongated, wherein each semiconductor layer 130 is arranged between two dielectric mesa regions 10 and each dielectric mesa region 10 is arranged between two semiconductor layers 130. Referring to FIG. 6, the MOS transistor may include a plurality of dielectric mesa regions 10 each including a field electrode 12 and a plurality of semiconductor layers 130. The semiconductor layers 130 will also be referred to as semiconductor mesa regions in the following.

Referring to FIG. 7, which illustrates a horizontal cross sectional view of an MOS transistor according to a further embodiment, there may be a plurality of dielectric mesa regions 10 that are pile-shaped and one semiconductor mesa region 130 that is grid-shaped. A plurality of pile-shaped dielectric mesa regions 10 can be formed by producing the first trench 201 with a grid-geometry. In the embodiment illustrated in FIG. 6, the dielectric mesa regions 10 are rectangular in the horizontal plane. However, this is only an example. The dielectric mesa regions 10 could also have other forms, such as elliptical, circular, hexagonal, or other polygonal.

Figure 8:
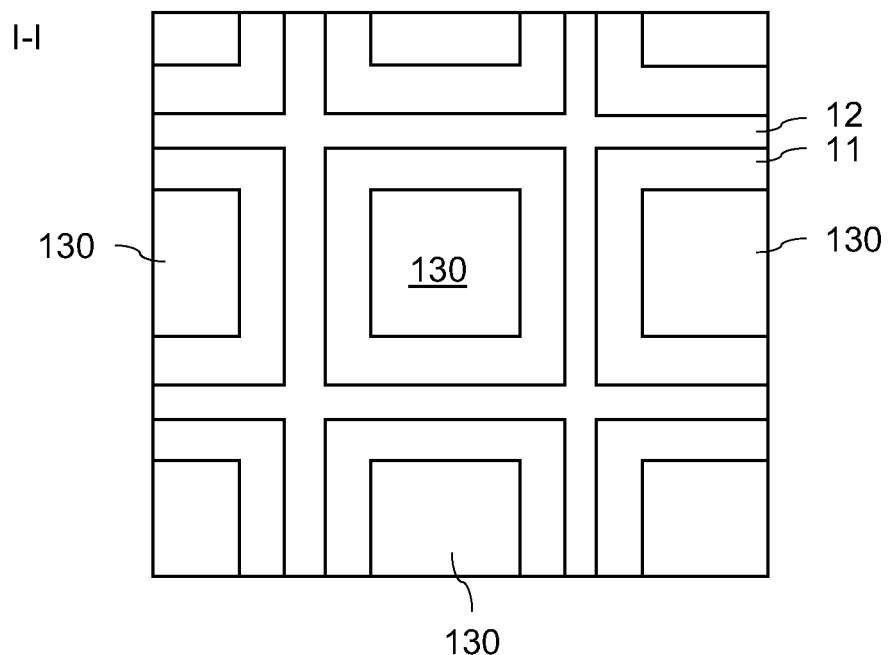
FIG. 8 illustrates a horizontal cross sectional view of a MOS transistor with a field electrode structure according to a third embodiment.

Referring to FIG. 8, which illustrates a horizontal cross section view of a MOS transistor according to a further embodiment, there could also be a plurality of pile-shaped semiconductor mesa regions 130 and one grid-shaped dielectric mesa region 10. This device structure is obtained by forming a plurality of pile-shaped first trenches 201. In the embodiment illustrated in FIG. 8, the semiconductor mesa regions 130 have a rectangular geometry in the horizontal plane. However, this is only an example. The semiconductor mesa region 130 could also be implemented with any other geometry, such as a circular geometry, an elliptical geometry, a hexagonal or any other polygonal geometry.

Referring to FIG. 5, the MOS transistor further includes a gate electrode 41 arranged adjacent the body region 32 and dielectrically insulated from the body region 32 by a gate dielectric 42. The gate electrode 41 extends from the source region 33 through the body region 32 to or into the drift region 31. In a conventional fashion, the gate electrode 41 serves to control a conducting channel in the body region 32 between the source region 33 and the drift region 31. The gate electrode 41 is electrically connected to a gate terminal G which is only schematically illustrated in FIG. 5 and electrically insulated from the source electrode 35 by an insulation layer 43. The source electrode 35 electrically contacts the source region 33, the body region 32 and the field electrode 12 and is electrically connected to a source terminal S that is only schematically illustrated in FIG. 5. Alternatively, the field electrode 12 is not electrically connected to the source electrode 35 but is electrically connected to the gate electrode 41 or the gate terminal G, respectively.

The MOS transistor further includes a drain region 34 in the semiconductor body 100 below the dielectric mesa regions 10 and the semiconductor mesa regions 130. According to one embodiment, the complete semiconductor body 100 forms the drain region 34. In this embodiment, the semiconductor body 100 has a homogenous doping concentration corresponding to the doping concentration of the drain region 34. According to a further embodiment (illustrated in FIG. 5) the semiconductor body 100 has a first semiconductor layer 110 and a second semiconductor layer 120. The first semiconductor layer 110 adjoins the semiconductor mesa region 130 and forms a section of the drift region 31. In this embodiment, the doping concentration of the first semiconductor layer 110 may correspond to the doping concentration of the semiconductor mesa region 130.

According to a further embodiment, the doping concentration of the semiconductor mesa region 130 is higher than the doping concentration of the first semiconductor layer 110. However, it is also possible to implement the mesa region 130 with a doping concentration lower than the doping concentration of the first semiconductor layer 110. The second semiconductor layer 120 has a higher doping concentration than the first semiconductor layer 110 and forms the drain region 34 of the MOS transistor. The second layer 120 may be a semiconductor substrate and the first layer 110 may be by an epitaxial layer formed on the substrate. According to a further embodiment, the semiconductor body 100 is a semiconductor substrate having a basic doping, with the first layer 110 including those sections of the substrate having the basic doping and with the second layer 120 being formed by implanting and/or diffusing dopant atoms into the substrate.

The doping concentrations of the drain and source regions 33, 34 are, for example, between 1E18 and 1E21, the doping concentration of the drift region 31 is, for example, between 1E13 and 1E17, and the doping concentration of the body region is, for example, between 1E15 and 1E18.

The MOS transistor can be implemented as an n-type transistor or as a p-type transistor. In an n-type transistor the source region 33 and the drift region 31 are n-doped, while the body region 32 is p-doped, and in a p-type transistor, the source region 33 and the drift region 31 are p-doped, while the body region 32 is n-doped. Further, the MOS transistor can be implemented as a MOSFET (Metal-Oxide-Semiconductor Field-Effect Transistor) or as an IGBT (Insulated Gate Bipolar Transistor). In a MOSFET, the drain region 34 has the same doping type as the drift region 31, while in an IGBT the drain region 34 has a doping type complementary to the doping type of the drift region 31. In an IGBT the drain region 34 is also referred to as collector region.

The operating principle of the MOS transistor illustrated in FIG. 5 corresponds to the operating principle of a conventional transistor. The transistor can be switched on and off by applying a suitable drive potential to the gate electrode 41. The transistor is switched on (is in an on-state) when the drive potential applied to the gate electrode 41 generates a conducting channel (inversion channel) in the body region 32 between the source region 33 and the drift region 31.

The operating principle is explained below. For explanation purposes it is assumed that the MOS transistor is an n-type transistor with an n-doped drift region. The operating principle, however, also applies to p-type transistors accordingly. When the MOS transistor is switched off, so that there is no conducting channel in the body region 32 between the source region 33 and the drift region 31, and when a voltage is applied between the drain and source terminals D, S that reverse biases the pn-junction between the body region 32 and the drift region 31 a depletion region (space charge region) expands in the drift region 31 starting at the pn-junction. Within the depletion region there are ionized dopant atoms in the drift region 31. These ionized dopant atoms have a positive charge when the drift region 31 is n-doped (and have a negative charge when the drift region 31 is p-doped). Negative charges corresponding to the positive charges in the drift regions 31 are located in the body region 32, but also in the field electrode 12 that has source potential or gate potential and that, therefore, has an electrical potential that is negative relative to the electrical potential of the drift region 31. Thus, not only the body region 32, but also the field electrode 12 provides counter charges corresponding to charges resulting from ionized dopant atoms in the drift region 31.

The voltage blocking capability of the semiconductor device is reached when the electrical field generated by ionized dopant atoms in the drift region 31 and corresponding counter charges in the body region 32 reaches the critical electrical field. The critical electrical field is a material constant of the semiconductor material of the semiconductor body 100 and the semiconductor mesa region 130. The reverse biasing voltage at which the critical electrical field is reached at the pn-junction is dependent on the doping concentration of the drift region 31 and is, therefore, dependent on the number of dopant atoms that can be ionized when a reverse biasing voltage is applied to the pn-junction. When, however, like in the semiconductor device of FIG. 5, ionized dopant atoms in the drift region 31 find corresponding counter charges not only in the body region 32 but also in the field electrode 12, the doping concentration of the drift region 31 can be increased without decreasing the voltage blocking capability of the semiconductor device. Increasing the doping concentration of the drift region 31 is beneficial concerning the on-resistance of the semiconductor device. In a unipolar semiconductor device, such as, for example, a MOSFET, the on-resistance is mainly defined by the ohmic resistance of the drift region 31, where the ohmic resistance of the drift region 31 decreases when the doping concentration of the drift region 31 increases.

The voltage across the field electrode dielectric 11 is dependent on the voltage applied between the drain and source terminals D, S and is also dependent on how far the field electrode 12 extends in the direction of the drain region 34. The voltage across the field electrode dielectric 11 can be as high as the voltage between the drain and source terminal D, S, so that the voltage blocking capability (dielectric strength) of the field electrode dielectric 100 can be up to several 100V. The dielectric strength of the field electrode dielectric 11 is dependent on the thickness d of the field electrode dielectric 100. With the method explained before, the thickness d of the field electrode dielectric 100 can be adjusted arbitrarily.

The MOS transistor illustrated in FIG. 5 is implemented as a trench-gate transistor. In this embodiment, the gate electrode 41 is arranged in a trench extending through the body region 31 to or into the drift region 31. In this embodiment, the trench with the gate electrode 41 is arranged in the semiconductor mesa region 130 distant to the dielectric mesa region 10.

Figure 9:
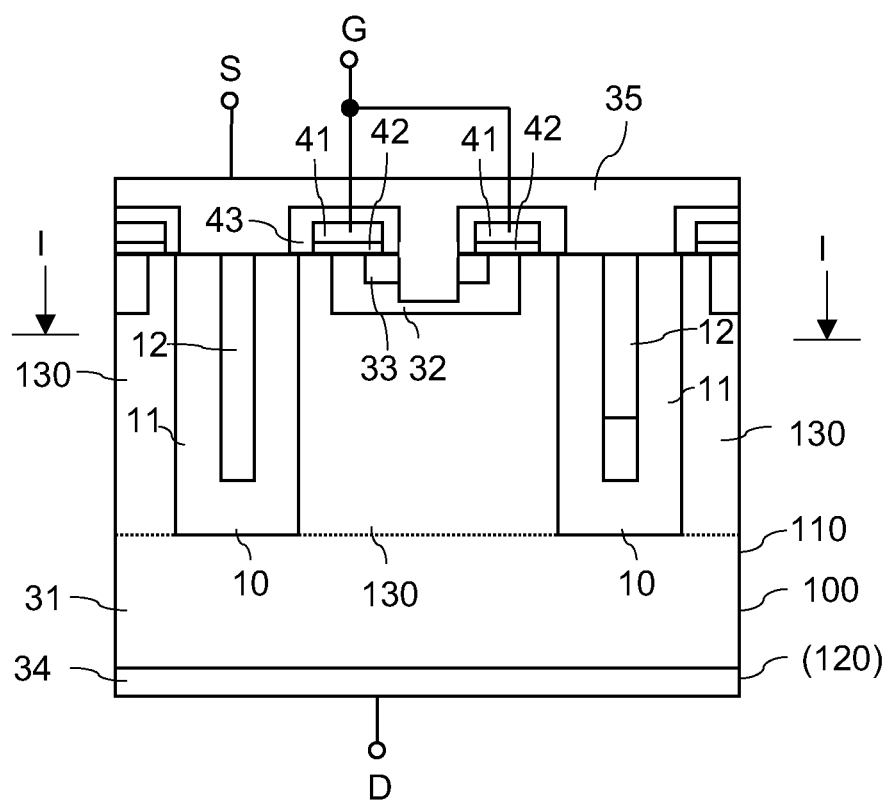
FIG. 9 illustrates a vertical cross sectional view of a MOS transistor including a field electrode according to a second embodiment.

FIG. 9 illustrates a vertical cross sectional view of a MOS transistor according to a further embodiment. The MOS transistor according to FIG. 9 is based on the MOS transistor according to FIG. 5, so that only the differences between the MOS transistor of FIG. 9 and the MOS transistor of FIG. 5 are explained. While the transistor according to FIG. 5 is a trench-gate transistor, the transistor according to FIG. 6 is planar-gate transistor. In this embodiment, the gate electrode 41 is arranged above the semiconductor mesa region 130. The gate electrode 41 extends between the source region 33 and a section of the drift region 31 extending to that surface of the semiconductor mesa region 130 on which the gate electrode 41 is arranged.

Figure 10:
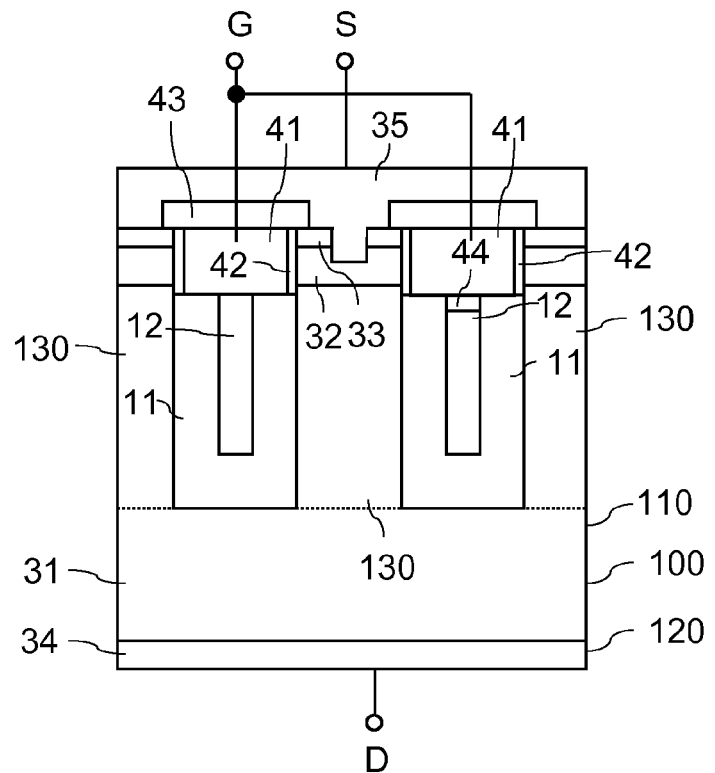
FIG. 10 illustrates a vertical cross sectional view of a MOS transistor including a field electrode according to a third embodiment.

FIG. 10 illustrates a vertical cross sectional view of a MOS transistor that is based on the MOS transistor of FIG. 5. In the MOS transistor of FIG. 10, the gate electrode 41 is arranged in a trench above the field electrode 12. The gate electrode 41 may adjoin the field electrode 12, so that the field electrode 12 is electrically connected to the gate terminal G. This is illustrated in the left part of FIG. 10.

According to a further embodiment, the gate electrode 41 is dielectrically insulated from the field electrode 12 by an insulation layer 44, and the field electrode 12 is electrically connected to the source terminal S (out of view in FIG. 10). The source electrode 35 is electrically connected to the source region 33 and the body region 32. Like in the embodiments of FIGS. 5 and 9 the source electrode 35 is electrically insulated from the gate electrode 41 by an insulation layer 43.

In the MOS transistor according to FIG. 10, the gate electrode 41 and the gate dielectric 42 can be formed by removing an upper section of the dielectric mesa region 10 and the field electrode 12 and by forming the gate electrode 41 and the gate dielectric 42 in this trench. "An upper section" of the dielectric mesa region 10 is a region adjacent the body region 32 and the source region 33.

Figure 11:
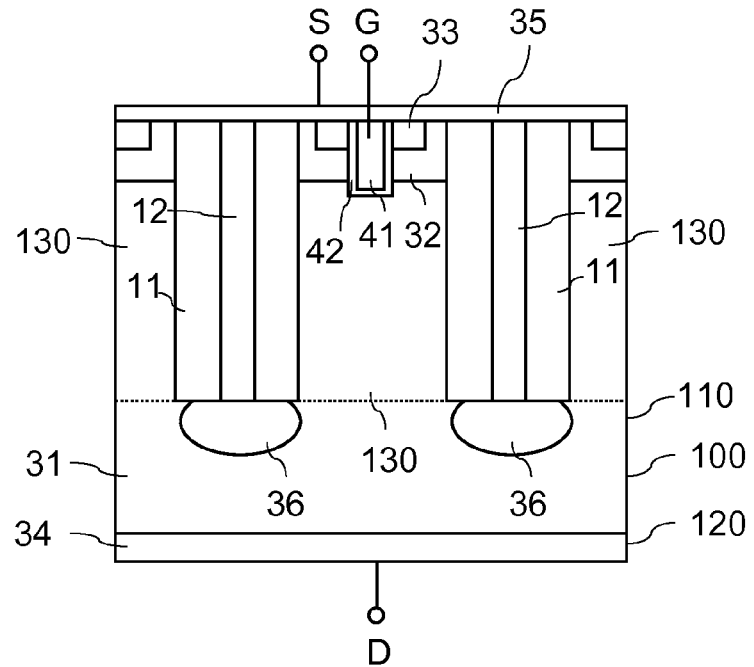
FIG. 11 illustrates a vertical cross sectional view of a MOS transistor including a field electrode according to a fourth embodiment.

FIG. 11 illustrates a further modification of the MOS transistor of FIG. 5. In the MOS transistor according to FIG. 11, the field electrode 12 extends through the dielectric mesa region 10 in the vertical direction of the semiconductor arrangement and is electrically connected to a compensation region 36 arranged in the drift region 31 below the dielectric mesa region 10. The compensation region 36 is doped complementarily to the drift region 31. In this semiconductor device, the field electrode 12 as well as the compensation region 36 provides counter charges to ionized dopant atoms when the semiconductor device is switched off.

Figure 12:
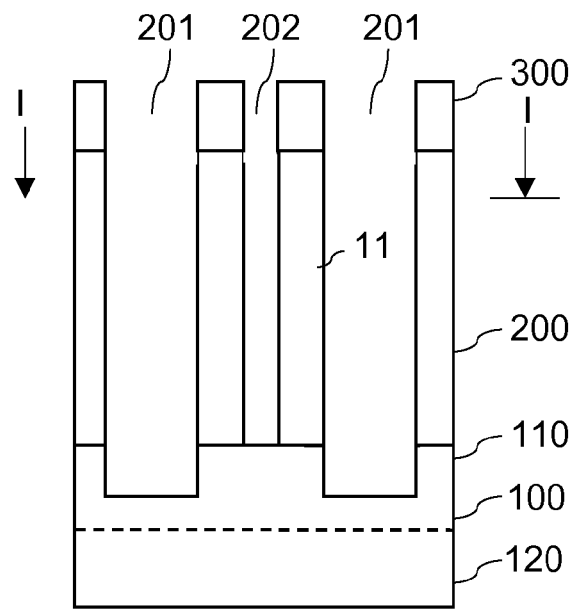
FIG. 12 illustrates a vertical cross sectional view of a semiconductor arrangement during a method for producing a semiconductor device according to a further embodiment.

A field electrode 12 extending through the dielectric mesa region 10 into the semiconductor body 100 can be produced by modifying the method illustrated in FIGS. 1A to 1C such that the second trench 202, like the at least one first trench 201 also extends to or into the semiconductor body 100. A vertical cross sectional view of the semiconductor arrangement after forming the at least one first trench 201 and the second trench 202 that extend through the dielectric layer 200 to the semiconductor body 100 is illustrated in FIG. 12. The at least one first trench 201 may extend deeper into the semiconductor body 100 than the second trench 202 when the at least one first trench 201 is wider than the second trench 202.

After forming the second trench 202 dopant atoms can be diffused and/or implanted in the semiconductor body 100 via the bottom of the first trench 201 in order to form the complementary regions 36 illustrated in FIG. 11. Further method steps that relate to forming the field electrode 12 and to forming the semiconductor mesa region 130 correspond to the method steps explained with reference to FIG. 1C, with the following differences: when the semiconductor layer 130 is grown on the bottom of the first trench 201 an epitaxial growth on the bottom of the second trench 202, that also extends down to the semiconductor body 100, should be prevented. For this, a protection layer (not shown), such as an oxide layer, is formed on the bottom of the second trench 202 before the selective epitaxial process. This protection layer is removed before forming the field electrode 12. Alternatively, the second trench 202 is formed after the first semiconductor layer 130 has been formed.

Figure 13:
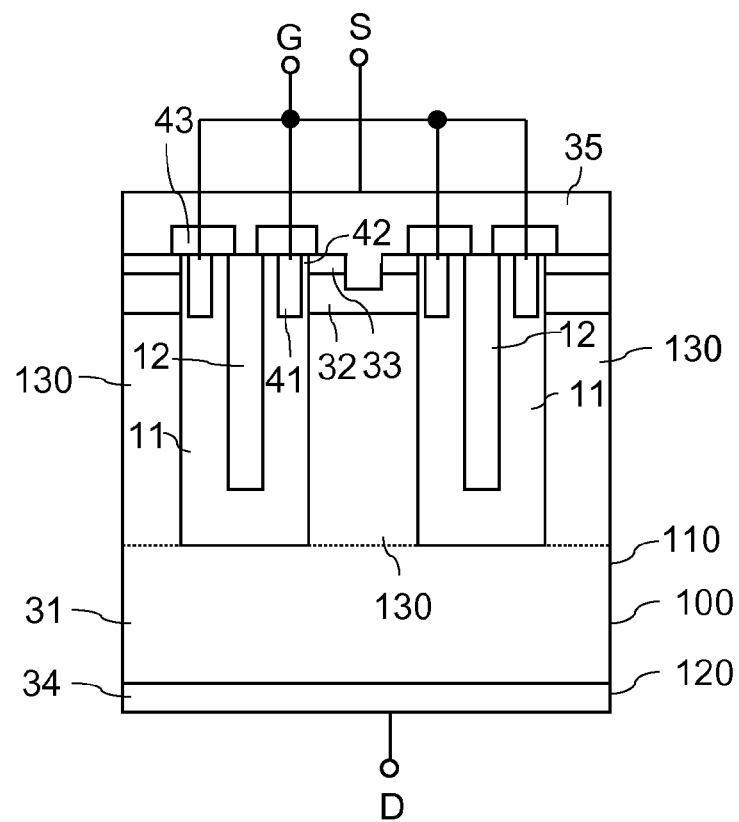
FIG. 13 illustrates a vertical cross sectional view of a MOS transistor according to a further embodiment.

FIG. 13 illustrates a vertical cross sectional view of a MOS transistor according to a further embodiment. This MOS transistor is also a modification of the MOS transistor of FIG. 5, whereas in the MOS transistor according to FIG. 13 the gate electrode 41 is arranged between the field electrode 12 and the semiconductor mesa region 130 in the dielectric mesa region 10. The gate electrode 41 is electrically insulated from the source electrode 33 and is electrically connected to the gate terminal G.

FIGS. 14A to 14D illustrate a method for producing the gate electrode 41 in the dielectric mesa region 10 between the field electrode 12 and the semiconductor mesa region 130. The method illustrated in FIGS. 14A to 14D is based on the structure illustrated in FIG. 1C. The method explained with reference to FIGS. 14A to 14D can be performed before or after producing the body regions and the source regions of the MOS transistor.

Figure 14A:
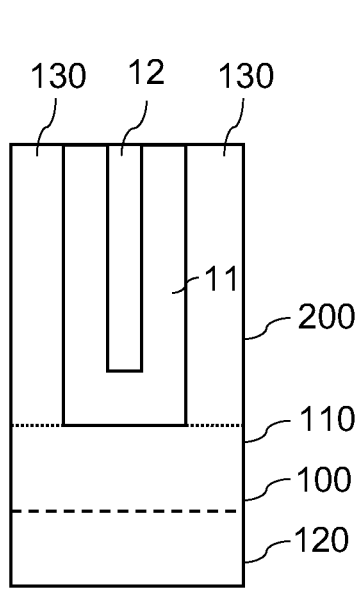
FIGS. 14A to 14D illustrates an embodiment of a method for producing a gate electrode in a MOS transistor according to FIG. 10.
Figure 14B:
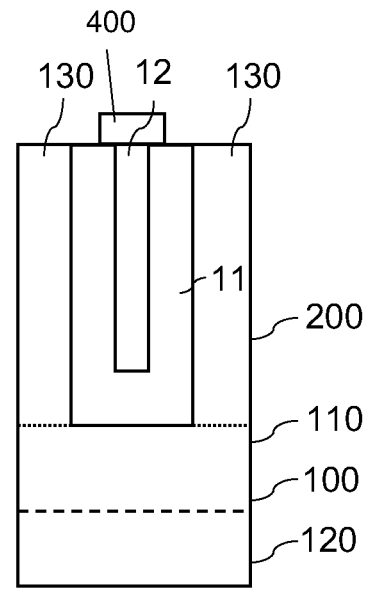

Referring to FIG. 14A, the method includes providing a semiconductor arrangement with a field electrode 12 and a field electrode dielectric 11. Referring to FIG. 14B an etch mask 400 is formed on top of the semiconductor arrangement, with the etch mask 400 at least covering the field electrode 12 and optionally covering sections of the field electrode dielectric 11.

Figure 14C:
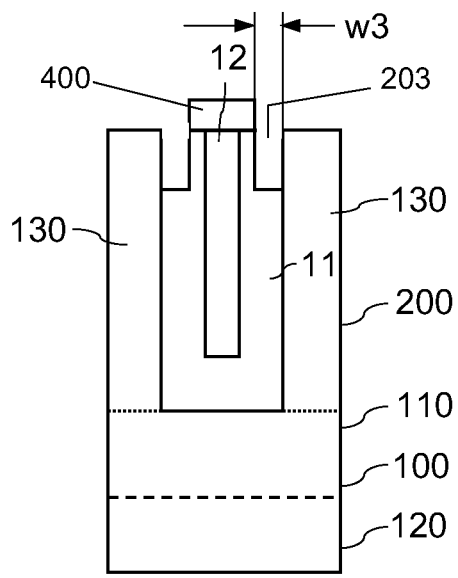

Referring to FIG. 14C, a trench 203 is etched in the field electrode dielectric 11. A width w3 of the trench 203 is defined by the etch mask 400 and the semiconductor mesa region 130. The trench 203 is, for example, produced using an anisotropic etching process that etches the dielectric material of the field electrode dielectric 11 selectively relative to the semiconductor mesa region 130.

Figure 14D:
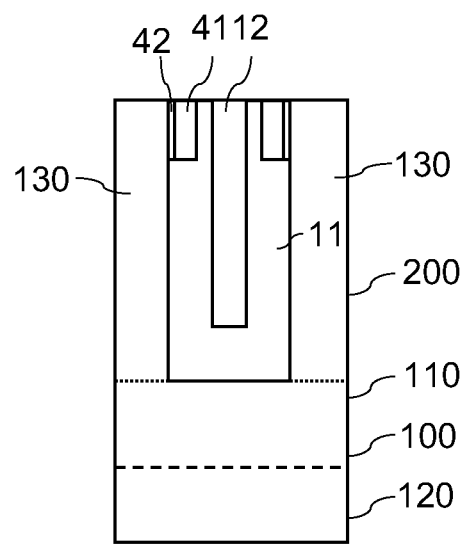

Referring to FIG. 14D, a gate dielectric 42 is formed on uncovered sections of the semiconductor mesa region 130. Forming the gate electrode dielectric 42 includes, for example, a thermal oxidation process. However, it is also possible to deposit a dielectric layer on uncovered regions of the semiconductor mesa region 130. Further, the gate electrode 41 is formed in a residual trench remaining after forming the gate dielectric 42. The gate electrode 41 includes an electrically conducting electrode material, such as a metal, a silicide or a doped polycrystalline semiconductor material, such as polysilicon.

Figure 15:
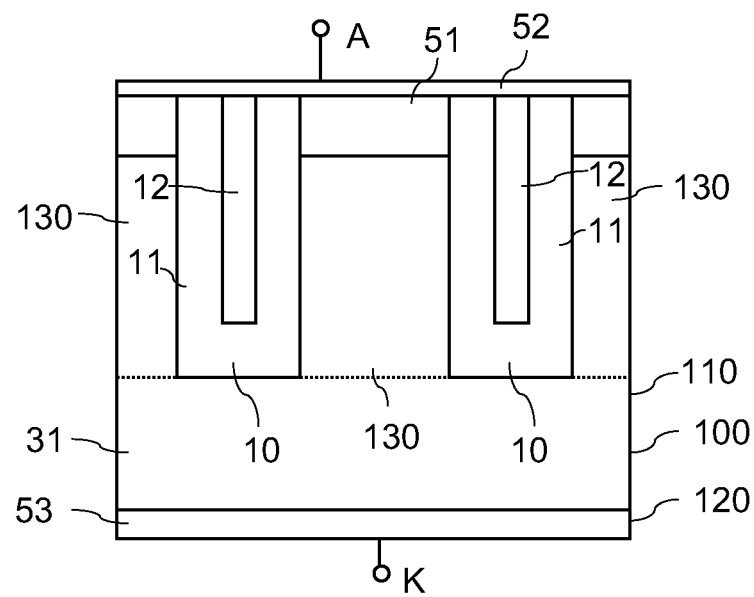
FIG. 15 illustrates a vertical cross sectional view of a bipolar diode including a field electrode and a field electrode dielectric.

A field electrode 12 surrounded by a field electrode dielectric as explained before is not restricted to be used in a MOS transistor but may also be employed in any type of power semiconductor device having a drift region 31 as well. For example, FIG. 15 illustrates a vertical cross sectional of a vertical power diode including a field electrode 12 and a field electrode dielectric insulating the field electrode 12 from the semiconductor regions of the diode. Like the MOS transistors of FIGS. 5, 9-11 and 13 the diode includes a drift region 31 that is at least formed by the semiconductor mesa region 130. A first emitter region 51 arranged in the semiconductor mesa region 130 adjoins the drift region 31. The first emitter region 51 is doped complementary to the drift region 31 and is electrically connected to a first electrode 52 that is also connected to the field electrode 12. This first electrode 52 forms or is connected to an anode terminal when the first emitter region 51 is p-doped.

A second emitter region 53 of the same doping type as the drift region 31 adjoins the drift region 31 distant to the pn junction between the first emitter region 51 and the drift region 31. The second emitter region 53 is connected to a cathode terminal K.

Figure 16:
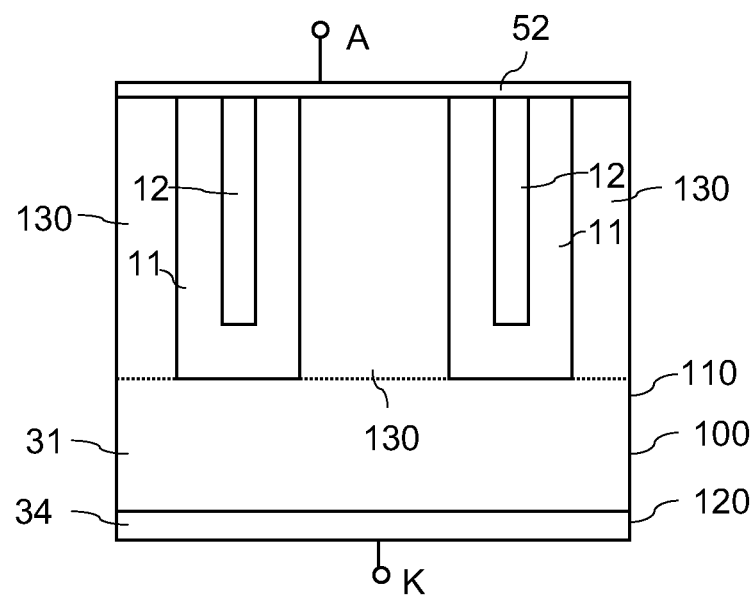
FIG. 16 illustrates a vertical cross sectional view of a Schottky diode including a field electrode and a field electrode dielectric.

FIG. 16 illustrates a vertical cross sectional view of a vertical power diode implemented as a Schottky diode. This diode is different from the diode of FIG. 15 in that the first electrode 52 contacts the drift region 31 and includes a Schottky metal so that a Schottky contact is formed between the first electrode 52 and the drift region 31.

Everything that has been set forth concerning the field electrode 12 and the field electrode dielectric 11 of the MOS transistors explained before applies to the field electrode 12 and the field electrode dielectric 11 of the diodes of FIGS. 15 and 16 as well. Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of producing a semiconductor device, the method comprising:
    providing a semiconductor body having a first surface and a dielectric layer arranged on the first surface;
    forming at least one first trench in the dielectric layer, the at least one first trench extending to the semiconductor body and defining a dielectric mesa region in the dielectric layer;
    forming a second trench in the dielectric layer, distant to the at least one first trench, leaving portions of the dielectric layer immediately adjacent the second trench in the dielectric mesa region, wherein the second trench is formed such that a bottom of the second trench is arranged within the dielectric layer;
    forming a semiconductor layer in the at least one first trench, on regions of the semiconductor body that are not covered by the dielectric layer in the at least one first trench; and
    forming a field electrode in the second trench.

2. The method of claim 1, wherein the semiconductor layer is a monocrystalline semiconductor layer.

3. The method of claim 2, wherein forming the semiconductor layer includes a selective epitaxial growth process.

4. The method of claim 1, wherein the at least one first trench and the second trench are formed with a common etching process, using one etch mask.

5. The method of claim 1, wherein the second trench is formed to extend to the semiconductor body.

6. The method of claim 1, wherein the at least one first trench and the second trench have vertical sidewalls.

7. The method of claim 1, wherein at least one of the at least one first trench and the second trench have tapered sidewalls.

8. The method of claim 1, wherein forming the at least one first trench comprises forming a ring-shaped first trench defining the dielectric mesa region.

9. The method of claim 1, wherein forming the at least one first trench comprises forming two distant first trenches, wherein the dielectric mesa region is formed between the two distant first trenches.

10. The method of claim 1, wherein the semiconductor layer completely fills the at least one first trench.

11. The method of claim 1, wherein the semiconductor layer is epitaxially grown by a selective epitaxial growth process.

12. The method of claim 1, wherein the semiconductor layer has a basic doping of a first doping type, the method further comprising:
    forming a body region of a second doping type in the semiconductor layer;
    forming a source region of the first doping type in the body region; and
    forming a gate electrode adjacent the body region and dielectrically insulated from the body region by a gate dielectric.

13. The method of claim 12, wherein forming the gate electrode comprises forming the gate electrode in a trench in the semiconductor layer distant to the dielectric mesa region.

14. The method of claim 12, wherein forming the gate electrode comprises forming the gate electrode above the semiconductor layer.

15. The method of claim 12, wherein forming the gate electrode comprises:
    forming at least one third trench in the dielectric mesa region distant to the field electrode; and
    forming the gate electrode in the at least one third trench.

16. The method of claim 15, further comprising:
    forming the at least one third trench such that a first sidewall of the at least one third trench adjoins the semiconductor layer; and
    forming a gate dielectric on the first sidewall of the at least one third trench before forming the gate electrode.

* * * * *